(12) United States Patent
Vasilache et al.

(10) Patent No.: US 9,202,473 B2
(45) Date of Patent: Dec. 1, 2015

(54) MULTIPLE SCALE CODEBOOK SEARCH

(75) Inventors: Adriana Vasilache, Tampere (FI); Lasse Juhani Laaksonen, Nokia (FI); Anssi Sakari Rämö, Tampere (FI); Mikko Tapio Tammi, Tampere (FI)

(73) Assignee: Nokia Technologies Oy, Espoo (FI)

( * ) Notice: Subject to any disclaimer, the term of this patent is extended or adjusted under 35 U.S.C. 154(b) by 172 days.

(21) Appl. No.: 14/128,859

(22) PCT Filed: Jul. 1, 2011

(86) PCT No.: PCT/IB2011/001541
§ 371 (c)(1),
(2), (4) Date: Dec. 23, 2013

(87) PCT Pub. No.: WO2013/005065
PCT Pub. Date: Jan. 10, 2013

(65) Prior Publication Data
US 2014/0129216 A1  May 8, 2014

(51) Int. Cl.
G10L 19/02 (2013.01)
G10L 19/038 (2013.01)
H03M 7/30 (2006.01)
H04N 19/94 (2014.01)
G10L 19/00 (2013.01)

(52) U.S. Cl.
CPC ............... *G10L 19/02* (2013.01); *G10L 19/038* (2013.01); *H03M 7/3082* (2013.01); *H04N 19/94* (2014.11); *G10L 2019/0013* (2013.01); *H03M 7/6041* (2013.01)

(58) Field of Classification Search
None
See application file for complete search history.

(56) References Cited

U.S. PATENT DOCUMENTS

| 8,468,017 | B2 * | 6/2013 | Shlomot et al. | 704/222 |
| 2005/0137863 | A1 * | 6/2005 | Jasiuk et al. | 704/222 |
| 2005/0228658 | A1 | 10/2005 | Yang et al. | |
| 2008/0316975 | A1 | 12/2008 | Ashikhmin | |
| 2010/0211398 | A1 * | 8/2010 | Satoh et al. | 704/500 |
| 2013/0218578 | A1 * | 8/2013 | Gao | 704/500 |
| 2013/0246055 | A1 * | 9/2013 | Gao | 704/205 |

OTHER PUBLICATIONS

International Search Report received for corresponding Patent Cooperation Treaty Application No. PCT/IB2011/001541, dated May 14, 2012, 4 pages.
Vasilache, A. et al. "Multiple-scale leader lattice VQ with application to LSF quantization", Signal Processing, vol. 82, 2002, pp. 563-586.

* cited by examiner

*Primary Examiner* — Jeremiah Bryar
(74) *Attorney, Agent, or Firm* — Nokia Technologies Oy

(57) ABSTRACT

It is inter alia disclosed to determine, for each set of basis code vectors of a plurality of sets of basis code vectors, a potential basis code vector for encoding an input vector, wherein each set of basis code vectors is associated with at least one scale representative of a plurality of scale representatives, and to determine a code vector for encoding the input vector from a subset of code vectors, said subset of code vectors comprising, for each determined potential basis code vector and each scale representative associated with the set of basis code vectors of the respective potential basis code vector, a code vector based on the respective potential basis code vector scaled by the respective scale representative.

24 Claims, 4 Drawing Sheets

MULTIPLE SCALE CODEBOOK SEARCH

FIELD

Embodiments of this invention relate to coding, in particular to speech and audio coding.

BACKGROUND

Low complexity algorithms for speech and audio coding constitute a very relevant asset, for instance for mobile terminal based communications. Due to low storage and low complexity, while preserving coding efficiency, structured codebooks may be preferred in several state of the art speech and audio codecs, like for instance the Enhanced Voice Service (EVS) codec to be standardized within the Third Generation Partnership Project (3GPP).

Codebooks used within these speech and audio codecs may for instance be based on lattice structures, as described in reference "Multiple-scale leader-lattice VQ with application to LSF quantization" by A. Vasilache, B. Dumitrescu and I. Tabus, Signal Processing, 2002, vol. 82, pages 563-586, Elsevier, which is incorporated herein in its entirety by reference.

It is possible to define a lattice codebook as a union of leader classes, each of which is characterized by a leader vector. A leader vector is an n-dimensional vector (with n denoting an integer number), whose (e.g. positive) components are ordered (e.g. decreasingly). The leader class corresponding to the leader vector then consists of the leader vector and all vectors obtained through all the signed permutations of the leader vector (with some possible restrictions). It is also possible that one, some or all leader classes are respectively associated with one or more scales, and the lattice codebook is then formed as a union of scaled and/or unscaled leader classes.

An input vector may for instance be encoded (for instance in quantization) by finding the nearest neighbour code vector in the codebook, i.e. the code vector that has the smallest distance with respect to the input vector. An identifier of this code vector (e.g. an index assigned to this code vector) then may serve as an encoded representation of the input vector.

The search in a multiple scale lattice codebook comprising several lattice truncations is done such that for each scale, the distortion is evaluated for all the leader classes in the truncation corresponding to the considered scale.

SUMMARY OF SOME EMBODIMENTS OF THE INVENTION

Although the use of structured codebooks already reduces the amount of memory and the computational complexity required for encoding an input vector, further reduction of the memory requirements and/or the computational complexity is desirable, for instance with respect to the nearest neighbour search in a multiple scale lattice codebook.

According to a first aspect of the invention, a method is disclosed, said method comprising determining, for each set of basis code vectors of a plurality of sets of basis code vectors, a potential basis code vector for encoding an input vector, wherein each set of basis code vectors is associated with at least one scale representative of a plurality of scale representatives, and determining a code vector for encoding the input vector from a subset of code vectors, said subset of code vectors comprising, for each determined potential basis code vector and each scale representative associated with the set of basis code vectors of the respective potential basis code vector, a code vector based on the respective potential basis code vector scaled by the respective scale representative.

According to a second aspect of the invention, an apparatus is disclosed, which is configured to perform the method according to the first aspect of the invention, or which comprises means for performing the method according to the first aspect of the invention, i.e. means for determining, for each set of basis code vectors of a plurality of sets of basis code vectors, a potential basis code vector for encoding an input vector, wherein each set of basis code vectors is associated with at least one scale representative of a plurality of scale representatives, and which comprises means for determining a code vector for encoding the input vector from a subset of code vectors, said subset of code vectors comprising, for each determined potential basis code vector and each scale representative associated with the set of basis code vectors of the respective potential basis code vector, a code vector based on the respective potential basis code vector scaled by the respective scale representative.

According to a third aspect of the invention, an apparatus is disclosed, comprising at least one processor and at least one memory including computer program code, the at least one memory and the computer program code configured to, with the at least one processor, cause the apparatus at least to perform the method according to the first aspect of the invention. The computer program code included in the memory may for instance at least partially represent software and/or firmware for the processor. Non-limiting examples of the memory are a Random-Access Memory (RAM) or a Read-Only Memory (ROM) that is accessible by the processor.

According to a fourth aspect of the invention, a computer program is disclosed, comprising program code for performing the method according to the first aspect of the invention when the computer program is executed on a processor. The computer program may for instance be distributable via a network, such as for instance the Internet. The computer program may for instance be storable or encodable in a computer-readable medium. The computer program may for instance at least partially represent software and/or firmware of the processor.

According to a fifth aspect of the invention, a computer-readable medium is disclosed, having a computer program according to the fourth aspect of the invention stored thereon. The computer-readable medium may for instance be embodied as an electric, magnetic, electro-magnetic, optic or other storage medium, and may either be a removable medium or a medium that is fixedly installed in an apparatus or device. Non-limiting examples of such a computer-readable medium are a RAM or ROM. The computer-readable medium may for instance be a tangible medium, for instance a tangible storage medium. A computer-readable medium is understood to be readable by a computer, such as for instance a processor.

In the following, features and embodiments pertaining to all of these above-described aspects of the invention will be briefly summarized.

Each set of potential basis code vectors comprises at least one basis code vector. For instance, since each set of basis code vectors is associated with at least one scale representative of a plurality of scale representatives, a code vector can be determined based on a basis code vector of a set of potential basis code vectors and a scale representative of the at least one scale representative associated with the set of potential basis code vectors, i.e. the code vector may be represented based on a basis code vector scaled by the respective scale representative. For instance, the scale representative may represent a scale value, wherein a code vector may be determined based on a multiplication of a basis code vector and the respective scale value.

For instance, at least one set of basis code vectors is associated with at least two scale representatives.

As an example, a codebook may comprise a set of code vectors comprising code vectors based on the plurality of sets of basis code vectors and based on the respective at least one scale value associated with a respective set of basis code vectors of the plurality of basis code vectors. This set of code vectors may comprise, for each basis code vector of each set of basis code vectors and for each of the at least one scale representative associated with the respective set of basis code vectors, a code vector based on the respective basis code vector scaled by the respective scale representative.

For instance, said sets of basis code vectors may represent leader classes, wherein each leader class comprises a different leader vector and permutations of said leader vector. Thus, said leader vector and the permutations of said leader vector may represent the basis code vectors of a respective set of basis code vectors.

The plurality of sets of basis code vectors may represent a subset of a second plurality of sets of basis code vectors. For instance, under the assumption that each set of basis code vector represents a leader class, the plurality of leader classes may represent a subset of a second plurality of leader classes. Thus, the plurality of leader classes may be considered as a truncated plurality of leaders classes with respect to the second plurality of leader classes.

For instance, the respective potential basis code vector may be determined by determining the basis code vector of the at least one basis code vector of the respective set of basis code vector which is nearest to the input vector to be encoded.

For instance, determining, for each set of basis code vectors of a plurality of sets of basis code vector, a potential code vector for encoding the input vector, is performed only once for each set of basis code vectors, irrespective of the number of scale representatives associated with the respective set of basis code vectors. This may result in a reduced search complexity.

Then, as an example, the code vector for encoding the input vector may be determined based on the set of determined potential code vectors, wherein said set of determined potential code vectors defines the subset of code vectors, said subset of code vectors comprising, for each determined potential basis code vector and each scale representative associated with the set of basis code vectors of the respective potential basis code vector, a code vector based on the respective potential basis code vector scaled by the respective scale representative.

Accordingly, the search for the code vector for encoding the input vector is performed in the subset of code vectors defined by the determined potential code vectors and defined by the respective at least one scale representative associated with the set of basis code vectors of the respective determined potential code vector. Since this subset of code vectors may represent a subset of code vectors associated with the codebook, the number of code vectors of this subset of code vectors may be less than the number of code vectors of the set of code vectors.

For instance, as an example, the plurality of sets of basis code vectors may be represented by $b_0 \ldots b_{X-1}$, wherein each $b_x$, with $x \in \{0, 1, \ldots X-1\}$, represents a set of basis code vector of the plurality of sets of basis code vectors, and wherein X represent the number of sets of the plurality of sets of basis code vectors. Each set of basis code vectors may be associated or may comprise at least one basis code vector $b_{x,y}$, wherein $B_x$ represents the number of basis code vectors of a respective set of basis code vectors $b_x$, i.e. $y \in \{0, 1, \ldots B_x-1\}$ may hold. For instance, the number $B_x$ of basis code vectors of a set of basis code vectors may be different for different sets of basis code vectors and/or it may be the same for at least two sets of basis code vectors.

Then, as an example, a code vector $c_{x,z,y}$ based on basis code vector $b_{x,y}$ and based on a scale representative $s_z$ may be determined, wherein index z represents the index of the respective scale representative of the plurality of scale representatives $s_0 \ldots s_{S-1}$, i.e. $z \in \{0, 1, \ldots S-1\}$ holds.

For instance, in case the values $b_{x,y,t}$ of the basis code vectors $b_{x,y} = [b_{x,y,0}, b_{x,y,1}, \ldots, b_{x,y,n-1}]$ represent absolute values, wherein $t \in \{0, 1, \ldots n-1\}$ holds and n represents the length of the respective basis code vector $b_{x,y}$, and if the absolute valued input vector is used for determining the potential code vector of a respective set of basis code vectors, the sign of each value $b_{x,y,t}$ at the (t+1)th position of the determined nearest basis code vector $b_{x,y}$ is assigned with the sign of the respective value $i_t$ at the (t+1)th position of the input vector i, before determining a code vector $c_{x,z,y}$ based on basis code vector $b_{x,y}$ and based on a scale representative $s_z$ is performed. As an example, if $i = [i_0, i_1, \ldots, i_{n-1}]$ represents the input vector, the absolute valued input vector may be represented by $[|i_0|, |i_1|, \ldots, |i_{n-1}|]$.

As a non-limiting example, a code vector $c_{x,z,y}$ may be determined by or based on $c_{x,z,y} = [b_{x,y,0} \cdot s_z, b_{x,y,1} \cdot s_z, \ldots, b_{x,y,n-1} \cdot s_z]$.

Each of the scale representatives $s_z$, wherein $z \in \{0, 1, \ldots S-1\}$ holds, is associated with at least one set of basis code vectors. For instance, as a non-limiting example this respective at least one set of basis code vectors may be represented by the set of basis code vectors $b_x$, with $x \in \{0, 1, \ldots n_z-1\}$, wherein $n_z$ may represent the number of sets of basis code vectors associated with the respective scale representative $s_z$, wherein $0 < n_z \leq X$ holds. Based on this linkage between a respective scale representative $s_z$ and the associated at least one set of basis code vectors $b_x$, with $n_z x \in \{0, 1, \ldots n_z-1\}$, the associated at least one set of code vectors $c_{x,z,y}$, with $x \in \{0, 1, \ldots n_z-1\}$ and $y \in \{0, 1, \ldots B_x-1\}$ and $z \in \{0, 1, \ldots S-1\}$, can be determined.

Thus, as an example, a codebook structure of the above mentioned codebook may be defined by the plurality of scale representatives $s_z$, the plurality of sets of basis code vectors $b_x$, and the linkage between each scale representative with the associated at least one set of basis code vectors.

Since at least one set of basis code vectors, e.g. at least the set of basis code vectors $b_0$, is associated with at least two scale representatives, the same set of basis code vectors can be used to construct code vectors of the at least one set of code vectors associated with a first scale representative and to construct code vectors of the at least one set of code vectors associated with at least one further scale representative.

For instance, in case said sets of basis code vectors represent leader classes, the at least one set of basis code vectors associated with a respective scale representative may be considered as a union of leader classes. Thus, the codebook may comprise at least one union of leader classes, wherein each union of leader classes is associated with one of at least one scale representative and with at least one set of basis code vectors of the plurality of sets of basis code vectors. As an example, the at least one scale representative may represent the plurality of scale representatives which may comprise at least two scale representatives.

According to an exemplary embodiment of all aspects of the invention, each scale representative of the plurality of scale representatives is associated with at least one set of code vectors, and each set of code vectors of said at least one set of code vectors associated with a respective scale representative is associated with a set of basis code vectors of the plurality of sets of basis code vectors such that each set of code vectors of said at least one set of code vectors associated with a respective scale representative comprises code vectors based on scaling the basis code vectors of the associated respective set of basis vectors with the respective scale representative.

Thus, the code vectors of the at least one set of code vectors associated with a respective scale representative of the plurality of scale representatives can be determined based on scaling the basis code vectors of each set of basis code vectors associated with the scale representative with this scale representative.

According to an exemplary embodiment of all aspects of the invention, at least one set of basis code vectors is associated with at least two scale representatives.

Since at least one set of the set of basis code vectors is associated with at least two scale representatives, the same set of basis code vectors of this at least one set can be used to construct code vectors of the at least one set of code vectors associated with a first scale representative and to construct code vectors of the at least one set of code vectors associated with at least one further scale representative.

According to an exemplary embodiment of all aspects of the invention, said determining, for each set of basis code vectors of a plurality of sets of basis code vectors, a potential basis code vector for encoding the input vector comprises determining the basis code vector on the basis of the respective set of basis code vectors which represents a nearest neighbour to the input code vector.

For instance, a respective potential basis code vector may be determined by determining the basis code vector of the at least one basis code vector of the respective set of basis code vector which is nearest to the input vector to be encoded. Any kind of suitable criterion may be used for finding the nearest basis code vector with respect to the input vector to be encoded.

Furthermore, as an example, the basis code vector which is nearest to the absolute valued input vector may be determined, wherein the absolute valued input vector comprises absolute values corresponding to the values of the input vector, wherein the potential basis code vector represents the determined nearest basis code vector. As an example, a potential basis code vector may be determined based on a nearest basis code vector with respect to the absolute valued input vector and based on information of signs of the values of the input vector, wherein this information may comprise the sign of a respective position of respective values in the input vector and is used to assign signs to values of the determined potential basis code vector. For instance, the signs of the values of the potential basis code vector may correspond to the signs of the values of the input vector at the same position in the vector, respectively, wherein this may hold if the parity of the basis code vectors of the set of basis code vectors is 0. As another example, if the parity of the basis code vectors of the set of basis code vectors is −1, the signs of the values of the potential basis code vector may be assigned corresponding to the signs of the values of the input vector at the same position in the vector, respectively, and if there are not an odd number of negative components, the value in the potential basis code vector having the lowest non-null absolute value may change its sign. Or, as another example, if the parity of the basis code vectors of the set of basis code vectors is +1, the signs of the values of the potential basis code vector may be assigned corresponding to the signs of the values of the input vector at the same position in the vector, respectively, and if there are not an even number of negative components, the value in the potential basis code vector having the lowest non-null absolute value may change its sign.

Accordingly, for instance, the search for the potential basis code vectors is performed only once for each set of basis code vectors, irrespective of the number of scale representatives associated with the respective set of basis code vectors. This may result in a reduced search complexity.

According to an exemplary embodiment of all aspects of the invention, said sets of basis code vectors are leader classes, and wherein each leader class comprises a different leader vector and permutations of said leader vector.

Thus, said leader vector and the permutations of said leader vector may represent the basis code vectors of the respective set of basis code vectors.

For instance, the at least one set of code vectors associated with a respective scale representative may be considered as a union of leader classes. Thus, the codebook may comprise at least one union of leader classes, wherein each union of leader class is associated with one of at least one scale representative and with at least one set of basis code vectors of the plurality of basis code vectors. The at least one scale representative may comprise at least two scale representatives.

According to an exemplary embodiment of all aspects of the invention, said sets of basis code vectors are leader classes, and wherein each leader class comprises a different leader vector and permutations of said leader vector, wherein each leader vector represents an n-dimensional vector comprising n absolute values arranged in a descending or an ascending order, and wherein said determining the potential code base vector of the respective set of basis code vectors comprises one of:

assign the value in position k in the leader vector of the respective set of basis code vectors to a position in the potential basis code vector which corresponds to the position of the k-highest absolute value of the input vector and setting the sign of this assigned value in the potential code base vector in accordance with the sign of the value of the input vector associated with the k-highest absolute value of the input vector, wherein $0 \leq k < n$ holds, in case the values of each leader vector are arranged in an descending order; and assign the value in position k in the leader vector of the respective set of basis code vectors to a position in the potential code base vector which corresponds to the position of the k-lowest absolute value of the input vector and setting the sign of this assigned value in the potential code base vector in accordance with the sign of the value of the input vector associated with the k-lowest absolute value of the input vector, wherein $0 \leq k < n$ holds, in case the values of each leader vector are arranged in an ascending order.

As an example, the leader vector l of the respective set of basis code vectors $b_x$ may be represented by $l = [l_0, l_1, \ldots, l_{n-1}]$, wherein $l_0, l_1, \ldots, l_{n-1}$ are absolute values. In case of a descending order $l_0$ represents the 1-highest value (i.e. first highest), $l_1$ represents the 2-highest (i.e. second highest) value and $l_{n-1}$ represents the n-highest value. In case of an ascending order $l_0$ represents the 1-lowest (i.e. first lowest) value, $l_1$ represents the 2-lowest (i.e. second lowest) value and $l_{n-1}$ represents the n-lowest value.

For instance, k may represent a position in the leader vector, wherein value $l_{k-1}$ of the respective leader vector represents the value at kth position in the respective leader vector.

As an example, this value $l_{k-1}$ may be assigned to a position in the potential basis code vector which corresponds to the position of the k-highest absolute value (in case of a descending ordered leader vector) or to the position of the k-lowest absolute value (in case of an ascending ordered leader vector) in the input vector. For instance, this position may be denoted as position m. As an example, the potential basis code vector may be represented by $p=[p_0, p_1, \ldots, p_{n-1}]$.

For instance, in case of the descending order of the leader vector, the value in position k of the leader vector, i.e. value $l_{k-1}$, is assigned to a position in the potential basis code vector which corresponds to the position of the k-highest absolute value in the input vector.

Furthermore, the sign (+ or −) of the assigned value in the potential basis code vector $p_{m-1}$ is set in accordance with the sign of the value of the input vector associated with the k-highest absolute value. Accordingly, $$p_{m-1} = l_{k-1} \cdot \text{sign}(i_{m-1}) \qquad (1)$$

may hold.

In this way, equation (1) may be performed for any position k in the leader vector in order to assign any $l_{k-1}$ to a position in the potential basis code vector which corresponds to the position of the k-highest or k-lowest absolute value in the absolute valued input vector ia.

For instance, if the leader vector l is ordered in an ascending way, then the method described above may be performed with m representing the position of the k-lowest value in the absolute valued input vector, wherein $p_{m-1} = l_{k-1} \cdot \text{sign}(i_{m-1})$ may hold.

The obtained potential code vector p may be associated with the respective set of basis code vectors $b_x$, wherein l represents the leader vector of this respective set of basis code vectors. For instance, with respect to the example process of determining a code vector based on a basis code vector $b_{x,y,t}$ and scale representative $s_z$ and described above, the potential code vector p may represent the nearest basis code vector $b_{x,y}$ of the set of basis code vectors $b_x$ with respect to the input vector, wherein the absolute valued input vector may be used for determining the potential code vector of a respective set of basis code vectors and wherein the sign of each value $b_{x,y,k-1}$ at the kth position of the determined nearest basis code vector $b_{x,y}$ is assigned with the sign of the respective value $i_k$ at the kth position of the input vector i, wherein $0 < k \leq n$ holds.

Thus, this nearest basis code vector $b_{x,y}$ representing the potential code vector p can be used for determining a code vector $c_{x,z,y}$ based on the nearest basis code vector $b_{x,y}$ and based on a respective scale representative $s_z$.

According to an exemplary embodiment of all aspects of the invention, said determining a code vector for encoding the input vector comprises for each determined potential basis code vector and for each scale representative associated with the set of basis code vectors of the respective potential basis code vector determining a distortion metric based on the respective code vector and the input, wherein the respective code vector represents the code vector based on the respective potential basis code vector scaled by the respective scale representative.

The code vector being associated with the best metric may be selected for encoding the input vector.

As an example, said distortion metric may be based on any kind of suitable distance between the determined code vector and the input vector. As an example, a Hamming distance or an Euclidian distance or any other distance may be used.

According to an exemplary embodiment of all aspects of the invention, the distortion metric represents a distance between the respective code vector and the input vector.

The code vector associated with the shortest distance may be selected for encoding the input vector.

For instance, if $c_{x,z,y}=[c_{x,z,y,0}, c_{x,z,y,1}, \ldots, c_{x,z,n-1}]$ represents the code vector and $i=[i_0, i_1, \ldots, i_{n-1}]$ represents the input vector, a distance d may be calculated based on $$d = \sum_{k=0}^{n-1} (i_k - c_{x,z,y,k})^2. \qquad (2)$$

According to an exemplary embodiment of all aspects of the invention, the respective code vector represents an n-dimensional vector comprising code vector values $c_0 \ldots _{n-1}$ and the input vector represents an n-dimensional vector comprising input vector values $i_0 \ldots i_{n-1}$, wherein determining the respective distance d is performed based on calculating d'

$$d' = \sum_{k=0}^{n-1} c_k^2 - 2\sum_{k=0}^{n-1} i_k \cdot c_k. \qquad (3)$$

This distortion metric (3) may be considered to represent a simplified metric of metric (2) without any loss of quality.

According to an exemplary embodiment of all aspects of the invention, the distortion metric is determined based on a weighting function.

According to an exemplary embodiment of all aspects of the invention, the respective code vector represents an n-dimensional vector comprising code vector values $c_0 \ldots _{n-1}$ and the input vector represents an n-dimensional vector comprising input vector values $i_0 \ldots i_{n-1}$, wherein determining the respective distance $d_w'$ is performed based on calculating $$d_w' = \sum_{k=0}^{n-1} w_k \cdot c_k^2 - 2\sum_{k=0}^{n-1} w_k \cdot i_k \cdot c_k,$$

wherein $w_k$ represent weighting factors of the weighting function.

According to an exemplary embodiment of all aspects of the invention, the said input vector at least partially represents at least one of a video, image, audio and speech signal.

According to an exemplary embodiment of all aspects of the invention, the identifying of the target vector forms part of a Third Generation Partnership Project (3GPP) speech and/or audio codec, in particular an Enhanced Voice Service (EVS) codec.

Other features of all aspects of the invention will be apparent from and elucidated with reference to the detailed description of embodiments of the invention presented hereinafter in conjunction with the accompanying drawings. It is to be understood, however, that the drawings are designed solely for purposes of illustration and not as a definition of the limits of the invention, for which reference should be made to the appended claims. It should further be understood that the drawings are not drawn to scale and that they are merely intended to conceptually illustrate the structures and procedures described therein. In particular, presence of features in the drawings should not be considered to render these features mandatory for the invention.

DETAILED DESCRIPTION OF EMBODIMENTS OF THE INVENTION

Figure 1A:
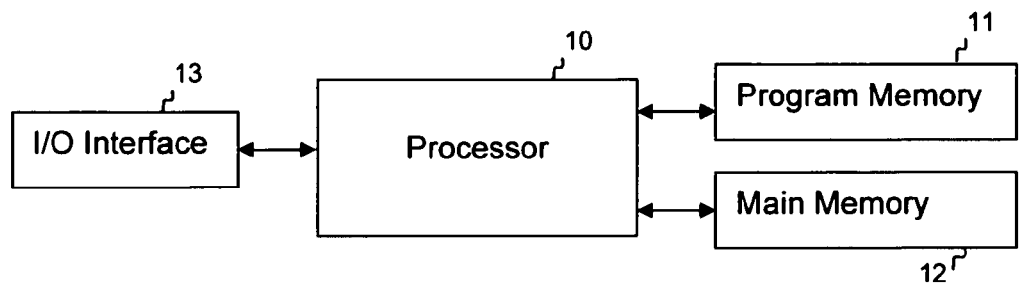
FIG. 1a: A schematic illustration of an apparatus according to an embodiment of the invention.

FIG. 1 schematically illustrates components of an apparatus 1 according to an embodiment of the invention. Apparatus 1 may for instance be an electronic device that is for instance capable of encoding at least one of speech, audio and video signals, or a component of such a device. Apparatus 1 is in particular configured to determine a code vector for encoding an input vector. Apparatus 1 may for instance be embodied as a module. Non-limiting examples of apparatus 1 are a mobile phone, a personal digital assistant, a portable multimedia (audio and/or video) player, and a computer (e.g. a laptop or desktop computer).

Apparatus 1 comprises a processor 10, which may for instance be embodied as a microprocessor, Digital Signal Processor (DSP) or Application Specific Integrated Circuit (ASIC), to name but a few non-limiting examples. Processor 10 executes a program code stored in program memory 11, and uses main memory 12 as a working memory, for instance to at least temporarily store intermediate results, but also to store for instance pre-defined and/or pre-computed databases. Some or all of memories 11 and 12 may also be included into processor 10. Memories 11 and/or 12 may for instance be embodied as Read-Only Memory (ROM), Random Access Memory (RAM), to name but a few non-limiting examples. One of or both of memories 11 and 12 may be fixedly connected to processor 10 or removable from processor 10, for instance in the form of a memory card or stick.

Processor 10 further controls an input/output (I/O) interface 13, via which processor receives or provides information to other functional units.

As will be described below, processor 10 is at least capable to execute program code for determining a code vector for encoding an input vector. However, processor 10 may of course possess further capabilities. For instance, processor 10 may be capable of at least one of speech, audio and video encoding, for instance based on sampled input values. Processor 10 may additionally or alternatively be capable of controlling operation of a portable communication and/or multimedia device.

Apparatus 1 of FIG. 1 may further comprise components such as a user interface, for instance to allow a user of apparatus 1 to interact with processor 10, or an antenna with associated radio frequency (RF) circuitry to enable apparatus 1 to perform wireless communication.

The circuitry formed by the components of apparatus 1 may be implemented in hardware alone, partially in hardware and in software, or in software only, as further described at the end of this specification.

Figure 1B:
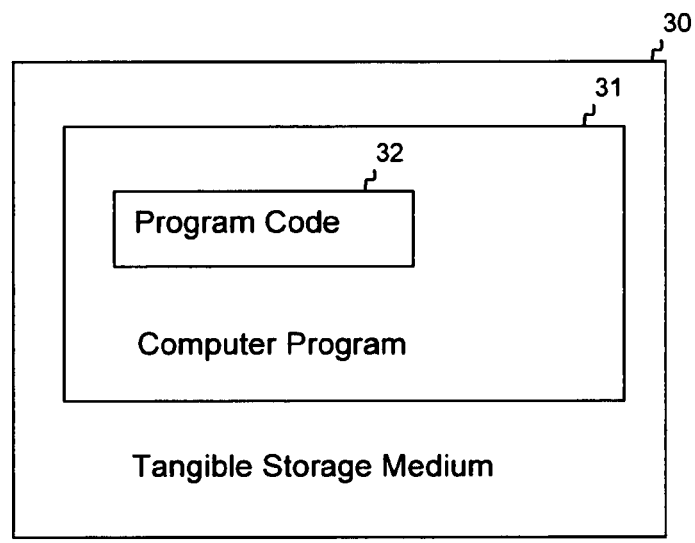
FIG. 1b: a tangible storage medium according to an embodiment of the invention.
Figure 2A:
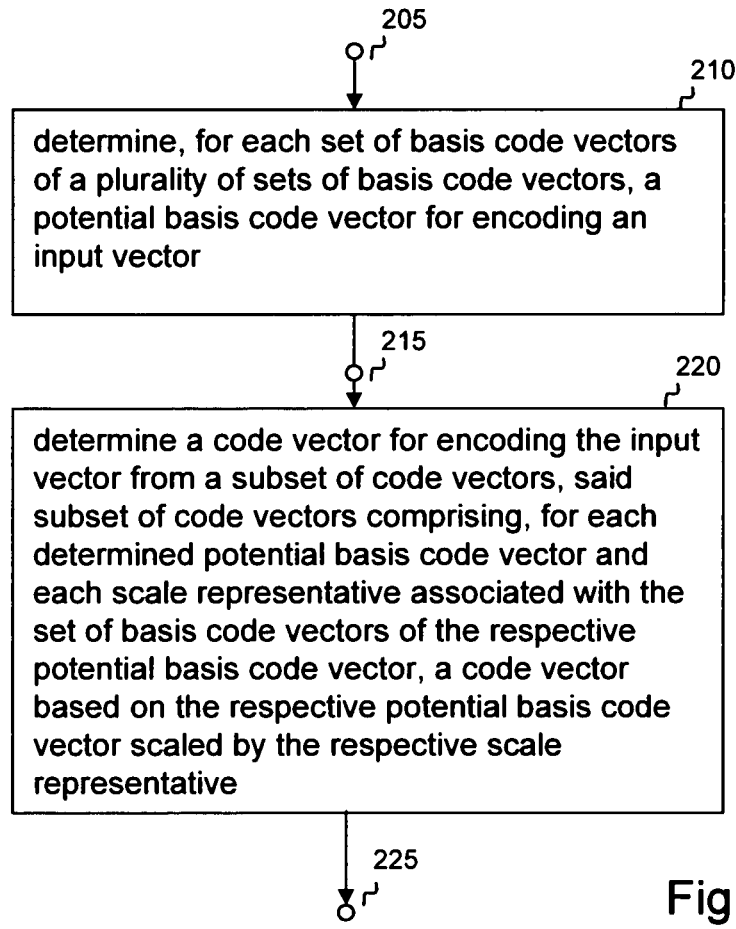
FIG. 2a: a flowchart of a method according to a first embodiment of the invention.

FIG. 2a shows a flowchart 200 of a method according to a first embodiment of the invention. The steps of this flowchart 200 may for instance be defined by respective program code 32 of a computer program 31 that is stored on a tangible storage medium 30, as shown in FIG. 1b. Tangible storage medium 30 may for instance embody program memory 11 of FIG. 1, and the computer program 31 may then be executed by processor 10 of FIG. 1.

Returning to FIG. 2a, in a step 210 for each set of basis code vectors of a plurality of sets of basis code vectors, a potential basis code vector for encoding an input vector is determined, wherein each set of basis code vectors is associated with at least one scale representative of a plurality of scale representatives, and in a step 220, a code vector for encoding the input vector from a subset of code vectors is determined, said subset of code vectors comprises, for each determined potential basis code vector and each scale representative associated with the set of basis code vectors of the respective potential basis code vector, a code vector based on the respective potential basis code vector scaled by the respective scale representative.

Thus, in step 210 a set of potential basis code vectors is determined, wherein each determined potential basis code vector of this set of potential basis code vectors is associated with a potential basis code vector of a different set of basis code vectors.

Each set of potential basis code vectors comprises at least one basis code vector. Since each set of basis code vectors is associated with at least one scale representative of a plurality of scale representatives, a code vector can be determined based on a basis code vector of a set of potential basis code vectors and a scale representative of the at least one scale representative associated with the set of potential basis code vectors, i.e. the code vector may be represented based on a basis code vector scaled by the respective scale representative. For instance, the scale representative may represent a scale value, wherein a code vector may be determined based on a multiplication of a basis code vector and the respective scale value.

For instance, at least one set of basis code vectors is associated with at least two scale representatives.

Accordingly, as an example, a codebook may comprise a set of code vectors comprising code vectors based on the plurality of sets of basis code vectors and based on the respective at least one scale value associated with a respective set of basis code vectors of the plurality of basis code vectors. This set of code vectors may comprise, for each basis code vector of each set of basis code vectors and for each of the at least one scale representative associated with a respective set of basis code vectors, a code vector based on the respective basis code vector scaled by the respective scale representative.

For instance, said sets of basis code vectors may represent leader classes, wherein each leader class comprises a different leader vector and permutations of said leader vector. Thus, said leader vector and the permutations of said leader vector may represent the basis code vectors of the respective set of basis code vectors.

The plurality of sets of basis code vectors may represent a subset of a second plurality of sets of basis code vectors. For instance, under the assumption that each set of basis code vector represents a leader class, the plurality of leader classes may represent a subset of a second plurality of leader classes. Thus, the plurality of leader classes may be considered as a truncated plurality of leaders classes with respect to the second plurality of leader classes.

For instance, the respective potential basis code vector may be determined by determining the basis code vector of the at least one basis code vector of the respective set of basis code vector which is nearest to the input vector to be encoded. Any kind of suitable criterion may be used for finding the nearest basis code vector with respect to the input vector to be encoded.

As an example, a potential basis code vector may be determined based on a nearest basis code vector with respect to the absolute valued input vector and based on information of signs of the values of the input vector, wherein this information may comprise the sign of a respective position of respective values in the input vector and is used to assign signs to values of the determined potential basis code vector. Furthermore, as an example, the basis code vector which is nearest to the absolute valued input vector may be determined, wherein the absolute valued input vector comprises absolute values corresponding to the values of the input vector, wherein the potential basis code vector represents the determined nearest basis code vector, wherein the signs of the values of the potential basis code vector correspond to the signs of the values of the input vector at the same position in the vector, wherein this may hold if the parity of the basis code vectors of the set of basis code vectors is 0. As another example, if the parity of the basis code vectors of the set of basis code vectors is −1, the signs of the values of the potential basis code vector may be assigned corresponding to the signs of the values of the input vector at the same position in the vector, respectively, and if there are not an odd number of negative components, the value in the potential basis code vector having the lowest non-null absolute value may change its sign. Or, as another example, if the parity of the basis code vectors of the set of basis code vectors is +1, the signs of the values of the potential basis code vector may be assigned corresponding to the signs of the values of the input vector at the same position in the vector, respectively, and if there are not an even number of negative components, the value in the potential basis code vector having the lowest non-null absolute value may change its sign.

Accordingly, for instance, in step 210 the search for the potential basis code vectors is performed only once for each set of basis code vectors, irrespective of the number of scale representatives associated with the respective set of basis code vectors. This may result in a reduced search complexity.

In step 220, the code vector for encoding the input vector is determined based on the set of determined potential code vectors, wherein said set of determined potential code vectors defines a subset of code vectors, said subset of code vectors comprising, for each determined potential basis code vector and each scale representative associated with the set of basis code vectors of the respective potential basis code vector, a code vector based on the respective potential basis code vector scaled by the respective scale representative.

Accordingly, the search for the code vector for encoding the input vector is performed in the subset of code vectors defined by the determined potential code vectors and defined by the respective at least one scale representative associated with the set of basis code vectors of the respective determined potential code vector. Since this subset of code vectors may represent a subset of code vectors associated with the codebook, the number of code vectors of this subset of code vectors may be less than the number of code vectors of the set of code vectors.

As an example, each scale representative of the plurality of scale representatives may be associated with at least one set of code vectors, wherein each set of code vectors of said at least one set of code vectors associated with a respective scale representative is associated with a set of basis code vectors of the plurality of sets of basis code vectors such that each set of code vectors of said at least one set of code vectors associated with a respective scale representative comprises code vectors obtained by scaling the basis vectors of the associated respective set of basis vectors with the respective scale representative.

Accordingly, the code vectors of the at least one set of basis code vectors associated with a respective scale representative of the plurality of scale representatives can be determined based on scaling the basis code vectors of each set of basis code vectors associated with the scale representative with this scale representative.

For instance, in case said sets of basis code vectors represent leader classes, the at least one set of basis code vectors associated with a respective scale representative may be considered as a union of leader classes. Thus, the codebook may comprise at last one union of leader classes, wherein each union of leader class is associated with one of at least one scale representatives and with at least one set of basis code vectors of the plurality of basis code vectors. As an example, the at least one scale representative may represent the plurality of scale representatives which may comprise at least two scale representatives.

Figure 2B:
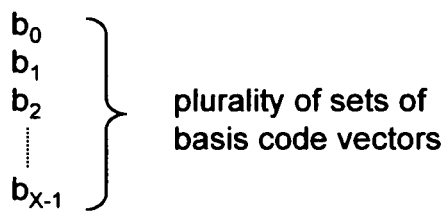
FIG. 2b: an example of a plurality of set of basis code vectors.

FIG. 2b depicts an example of a plurality of set of basis code vectors, wherein each $b_x$, with $x \in \{0, 1, \ldots X-1\}$, represents a set of basis code vector of the plurality of sets of basis code vectors, wherein X represent the number of sets of the plurality of sets of basis code vectors. Each set of basis code vectors is associated or comprises at least one basis code vector $b_{x,y}$, wherein $B_x$ represents the number of basis code vectors of a respective set of basis code vectors $b_x$, i.e. $y \in \{0, 1, \ldots B_x-1\}$ holds. For instance, the number $B_x$ of basis code vectors of a set of basis code vectors may be different for different sets of basis code vectors and/or it may be the same for at least two sets of basis code vectors.

Figure 2C:
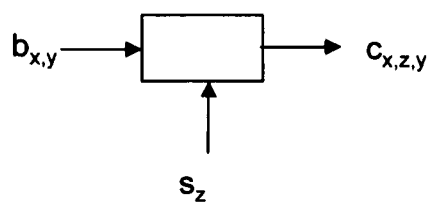
FIG. 2c: an example process of determining a code vector.

FIG. 2c depicts an example process of determining a code vector $c_{x,z,y}$ based on basis code vector $b_{x,y}$ and based on a scale representative $s_z$, wherein index z represents the index of the respective scale representative of the plurality of scale representatives $s_0 \ldots s_{S-1}$, i.e. $z \in \{0, 1, \ldots S-1\}$ holds.

For instance, in case the values $b_{x,y,t}$ of the basis code vectors $b_{x,y}=[b_{x,y,0}, b_{x,y,1}, \ldots, b_{x,y,n-1}]$ represent absolute values, wherein $t \in \{0, 1, \ldots n-1\}$ holds and n represents the length of the respective basis code vector $b_{x,y}$, and if the absolute valued input vector is used for determining the potential code vector of a respective set of basis code vectors, the sign of each value $b_{x,y,t}$ at the (t+1)th position of the determined nearest basis code vector $b_{x,y}$ may be assigned based on the sign of the respective value $i_t$ at the (t+1)th position of the input vector i, before determining a code vector $c_{x,z,y}$ based on basis code vector $b_{x,y}$ and based on a scale representative $s_z$ is performed, as exemplarily depicted in FIG. 2c. As an example, if $i=[i_0, i_1, \ldots, i_{n-1}]$ represents the input vector, the absolute valued input vector may be represented by $[|i_0|, |i_1|, \ldots, |i_{n-1}|]$. For instance, the sign of each value $b_{x,y,t}$ at the (t+1)th position of the determined nearest basis code vector $b_{x,y}$ may be assigned to the sign of the respective value $i_t$ at the (t+1)th position of the input vector, respectively, wherein this may hold if the parity of the basis code vectors $b_{x,y}$ of the set of basis code vectors $b_x$ is 0. As another example, if the parity of the basis code vectors $b_{x,y}$ of the set of basis code vectors $b_x$ is −1, the signs of the values $b_{x,y,t}$ of the potential basis code vector may be assigned corresponding to the signs of the values of the input vector at the same position in the vector, respectively, and if there are not an odd number of negative components, the value $b_{x,y,t}$ in the potential basis code vector having the lowest non-null absolute value may change its sign. Or, as another example, if the parity of the basis code vectors $b_{x,y}$ of the set of basis code vectors $b_x$ is +1, the signs of the values $b_{x,y,t}$ of the potential basis code vector may be assigned corresponding to the signs of the values of the input vector at the same position in the vector, respectively, and if there are not an even number of negative components, the value $b_{x,y,t}$ in the potential basis code vector having the lowest non-null absolute value may change its sign As a non-limiting example, a code vector $c_{x,z,y}$ may be determined by $c_{x,z,y} = [b_{x,y,0} \cdot s_z, b_{x,y,1} \cdot s_z, \ldots, b_{x,y,n-1} \cdot s_z]$.

Each of the scale representatives $s_z$, wherein $z \in \{0, 1, \ldots S-1\}$ holds, is associated with at least one set of basis code vectors. For instance, as a non-limiting example this respective at least one set of basis code vectors may be represented by the set of basis code vectors $b_x$, with $x \in \{0, 1, \ldots n_z-1\}$, wherein $n_z$ may represent the number of sets of basis code vectors associated with the respective scale representative $s_z$, wherein $0 < n_z < X$ holds. Based on this linkage between a respective scale representative $s_z$ and the associated at least one set of basis code vectors $b_x$, with $x \in \{0, 1, \ldots n_z-1\}$, the associated at least one set of code vectors $c_{x,z,y}$, with $x \in \{0, 1, \ldots n_z-1\}$ and $y \in \{0, 1, \ldots B_x-1\}$ and $z \in \{0, 1, \ldots S-1\}$, can be determined.

Thus, as an example, a codebook structure of the above mentioned codebook may be defined by the plurality of scale representatives $s_z$, the plurality of sets of basis code vectors $b_x$, and the linkage between each scale representative with the associated at least one set of basis code vectors.

Since at least one set of basis code vectors, e.g. at least the set of basis code vectors $b_0$, is associated with at least two scale representatives, the same set of basis code vectors can be used to construct code vectors of the at least one set of code vectors associated with a first scale representative and to construct code vectors of the at least one set of code vectors associated with at least one further scale representative.

Figure 3:
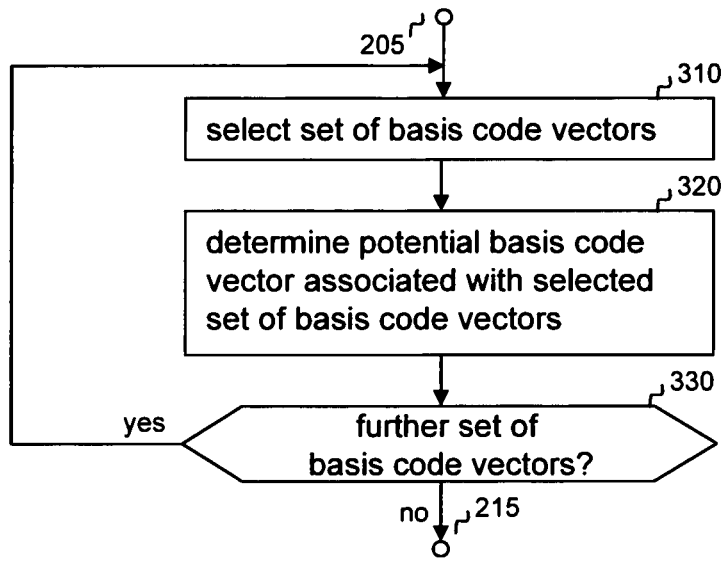
FIG. 3: a flowchart of a method according to a second embodiment of the invention.

FIG. 3 depicts a flowchart of a method according to a second embodiment of the invention, which may be applied for determining, for each set of basis code vectors of a plurality of sets of basis code vectors, a potential basis code vector for encoding an input vector, e.g. for replacing step 210 depicted in FIG. 2a. Thus, for instance, the method depicted in FIG. 3 may be inserted between reference signs 205 and 215 in order to replace step 210.

In a step 310 a set of basis code vectors of the plurality of basis code vectors is selected.

Then, in a step 320 a potential basis code vector associated with the selected set of basis code vectors for encoding the input vector is determined. This determining of potential basis code vectors associated with the selected set of basis code vectors for encoding the input vector may be performed as described with respect to the method according to a first embodiment of the invention. For instance, a nearest neighbour search may be performed to find the nearest basis code vector of the basis code vectors and the potential code vector may represent this nearest basis code vector or may be determined based on hits nearest basis code vector.

Afterwards, in a step 330, it is checked whether there is a further set of basis code vectors in the plurality of sets of basis code vectors. If yes, the method proceeds with selecting the further set of basis code vectors in step 310. If no, the method finishes the loop depicted in the flowchart of FIG. 3.

Thus, a potential basis code vector for encoding the input vector can be determined for each set of basis code vectors by means of the method according to a second embodiment of the invention depicted in FIG. 3.

Figure 4:
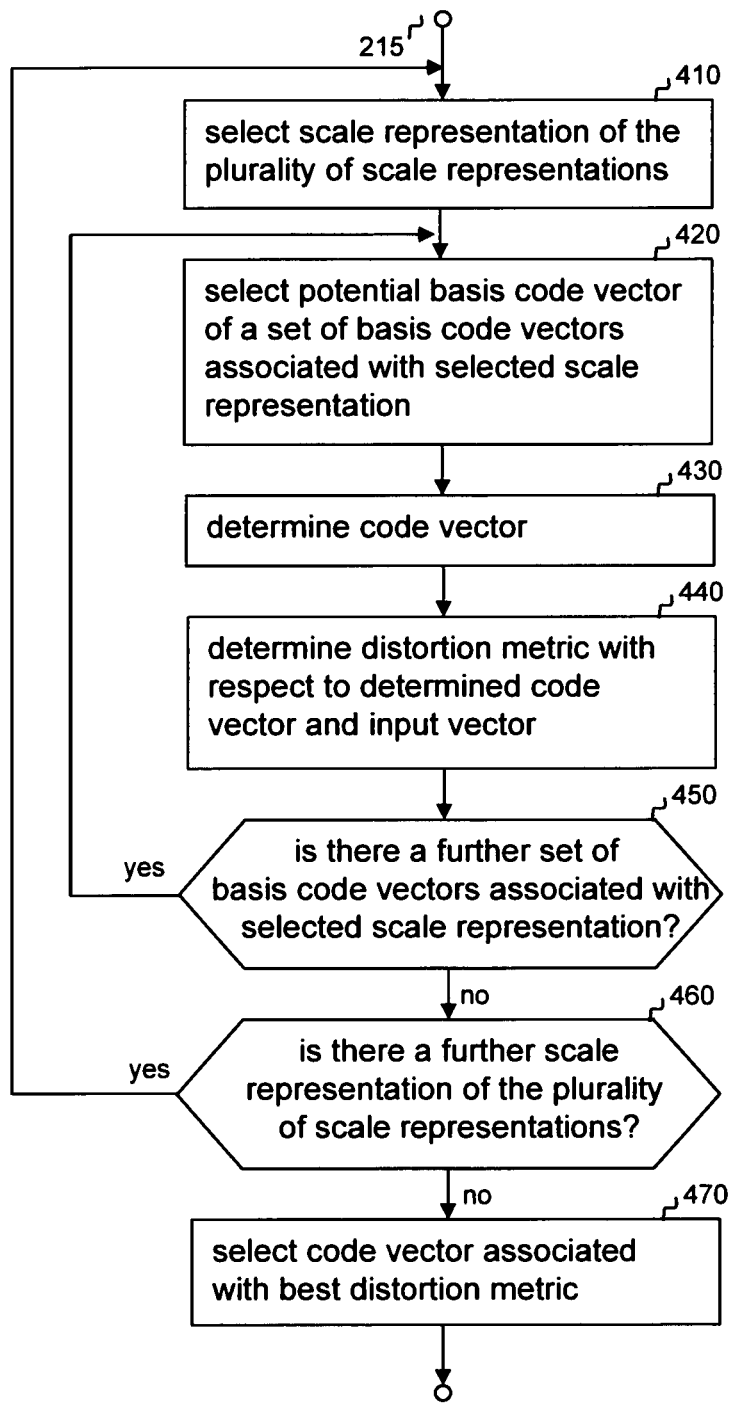
FIG. 4: a flowchart of a method according to a third embodiment of the invention.

FIG. 4 depicts a flowchart of a method according to a third embodiment of the invention, which may be applied for determining a code vector for encoding the input vector from a subset of code vectors, e.g. for replacing step 220 depicted in FIG. 2a. Thus, for instance, the method depicted in FIG. 4 may be inserted between reference signs 215 and 225 in order to replace step 220.

In a step 410, a scale representation of the plurality of scale representations is selected.

The, in a step 420, the determined potential basis code vector of a set of basis code vectors associated with the selected scale representation is selected.

Afterwards, in an optional step 430, a code vector may be determined based on the selected potential basis code vector and on the selected scale representation, wherein this determining of a code vector may be performed as described with respect to the method according to a first embodiment, for instance as described with respect to FIG. 2c.

Based on the determined code vector and the input vector, a distortion metric is determined in a step 440. For instance, said distortion metric may be based on any kind of suitable distance between the determined code vector and the input vector. As an example, a Hamming distance or an Euclidian distance or any other distance may be used. As an example, determining the code vector in step 430 may be omitted and the distortion metric may be calculated by inherently considering the respective code vector associated with the selected scale representation and the set of basis code vectors associated with this selected scale representation.

For instance, if $c_{x,z,y} = [c_{x,z,y,0}, c_{x,z,1}, \ldots, c_{x,z,n-1}]$ represents the code vector determined in step 430 and $i = [i_0, i_1, \ldots, i_{n-1}]$ represents the input vector, a distance d may be calculated based on $$d = \sum_{k=0}^{n-1} (i_k - c_{x,z,y,k})^2. \quad (4)$$

This distance d according to equation (4) may be replaced with distance d' calculated based on $$d' = \sum_{k=0}^{n-1} c_{x,z,y,k}^2 - 2 \sum_{k=0}^{n-1} i_k \cdot c_{x,z,y,k}. \quad (5)$$

Or, as another example, in case the distortion metric is determined based on a weighting function, distance d according to equation (4) may be amended as follows:

$$d_w = \sum_{k=0}^{n-1} w_k \cdot (i_k - c_{x,z,y,k})^2, \quad (6)$$

wherein $w_k$ represent weighting factors of the weighting function.

Accordingly, distance d' according to equation (5) may by weighted by means of the weighting function in the following way:

$$d'_w = \sum_{k=0}^{n-1} w_k \cdot c_{x,z,y,k}^2 - 2\sum_{k=0}^{n-1} w_k \cdot i_k \cdot c_{x,z,y,k} \qquad (7)$$

For instance, the distortion metric d, or d', or $d_w$, or $d_w'$ may be stored, if it is the first determined distortion metric, or it may be compared with a stored distortion metric, wherein the stored distortion metric is replaced if the newly determined distortion metric is better than the stored distortion metric. Furthermore, the code vector associated with the stored distortion metric may be stored or an identifier of this code vector may be stored.

Then, in a step 450, it is checked whether there is a further set of basis code vectors associated with the selected scale representation. If yes, the method proceeds with step 420 by selecting the determined potential basis code vector of this further set of basis code vectors associated with the selected scale representation. If no, the method proceeds at step 460 for checking whether there is a further scale representation of the plurality of scale representations.

If there is a further scale representation of the plurality of scale representations, the method proceeds at step 410 with selecting the further scale representation, otherwise the method may proceed with step 470.

In step 470, the code vector associated with the best distance metric may be selected for encoding the input vector.

For instance, said sets of basis code vectors may represent leader classes, wherein each leader class comprises a different leader vector and permutations of said leader vector. Thus, said leader vector and the permutations of said leader vector may represent the basis code vectors of the respective set of basis code vectors. As an example, a leader vector is an n-dimensional vector (with n denoting an integer number), whose (positive) components are ordered (e.g. decreasingly). The leader class corresponding to the leader vector then consists of the leader vector and all vectors obtained through all the signed permutations of the leader vector (with some possible restrictions).

A union of leader classes may be defined by the sets of basis code vectors associated with the same scale representation of the plurality of scale representations and the respective scale representation. For instance, a union of leader classes may be associated with a set of code vectors obtained by means of scaling the basis code vectors of the associated step of basis code vectors with the scale representative.

Such a union of leader classes may be considered as a truncation. Thus, if the plurality of scale representations are n scale representations, n unions of leader classes may be defined, wherein each union of leader class is defined by means of the respective scale representation and the sets of basis code vectors associated with the respective scale representation.

Accordingly, the plurality of scale representations and the plurality of sets of basis code vectors may define a plurality of union of leader classes thereby defining a codebook, wherein, as an example, each union of leader classes may be considered as a union of scaled leader classes.

Codebooks used within these speech and audio codecs may for instance be based on lattice structures, as described in reference "Multiple-scale leader-lattice VQ with application to LSF quantization" by A. Vasilache, B. Dumitrescu and I. Tabus, Signal Processing, 2002, vol. 82, pages 563-586, Elsevier, which is incorporated herein in its entirety by reference. For instance, a D10+ lattice may be considered for quantization, but any other well-suited lattice quantization may also be considered.

Figure 5:
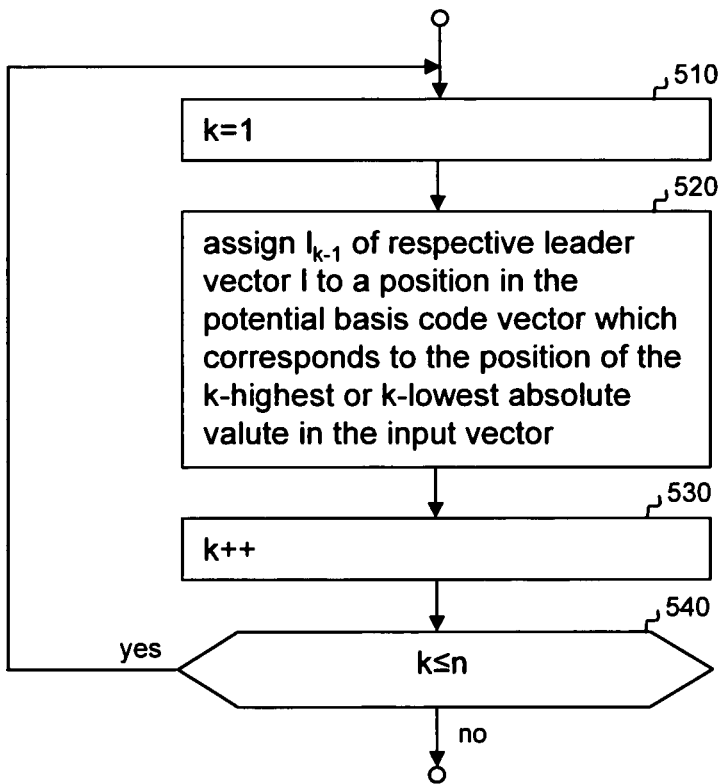
FIG. 5: a flowchart of a method according to a fourth embodiment of the invention.

FIG. 5 depicts a flowchart of a method according to a fourth embodiment of the invention, which may be applied for determining a potential basis code vector associated with a selected set of basis code vectors for encoding the input vector. For instance, this method according to a fourth embodiment of the invention may be used in step 210 of the method according to a first embodiment of the invention and/or in step 320 of the method according to a second embodiment of the invention.

It is assumed that the sets of basis code vectors are leader classes, wherein each leader class comprises a different leader vector and permutations of said leader vector, and wherein each leader vector represents an n-dimensional vector comprising n absolute values arranged in a descending or an ascending order.

Then, said determining the potential code base vector of a respective set of basis code vectors may be performed in accordance with the method according to a fourth embodiment of the invention.

The leader vector l of the respective set of basis code vectors $b_x$ may be represented by $l=[l_0, l_1, \ldots, l_{n-1}]$, wherein $l_0, l_1, \ldots, l_{n-1}$ are absolute values. In case of a descending order $l_0$ represents the 1-highest value, $l_1$ represents the 2-highest value and $l_{n-1}$ represents the n-highest value. In case of an ascending order $l_0$ represents the 1-lowest value, $l_1$ represents the 2-lowest value and $l_{n-1}$ represents the n-lowest value.

For instance, in optional step 510 the position counter k of the leader vector may be set to 1.

Then, in step 520, value $l_{k-1}$ of the respective leader vector, which represents the value at kth position in the respective leader vector, is assigned to a position in the potential basis code vector which corresponds to the position of the k-highest absolute value (in case of a descending ordered leader vector) or to the position of the k-lowest absolute value (in case of an ascending ordered leader vector) in the input vector. For instance, this position may be denoted as position m. As an example, the potential basis code vector may be represented by $p=[p_0, p_1, \ldots, p_{n-1}]$.

For instance, as a non-limiting example, an exemplary input vector may be $i=[-2.4, 5.0, -1.3, 0.2]$, wherein the corresponding absolute valued input vector may result in $ia=[2.4, 5.0, 1.3, 0.2]$.

In case of the descending order of the leader vector, the value in position k of the leader vector, i.e. value $l_{k-1}$, is assigned to a position in the potential basis code vector which corresponds to the position of the k-highest absolute value in the input vector. For instance, starting with the first position represented by counter k=1, the position of the 1-highest absolute value in the input vector is position m=2, since value 5.0 is the 1-highest value in the absolute valued input vector and is located in position m=2, i.e. $ia_1$. Accordingly, value $l_0$ is assigned to the position m=2 in the potential basis code vector, i.e. $p_1=l_0$ may hold.

Furthermore, the sign (+ or −) of the assigned value in the potential basis code vector $p_{m-1}$ is set in accordance with the sign of the value of the input vector associated with the k-highest absolute value. Accordingly, $$p_{m-1}=l_{k-1}\cdot\mathrm{sign}(i_{m-1}) \qquad (8)$$

may hold.

Thus, in the non-limiting example of an exemplary input vector $i=[-2.4, 5.0, -1.3, 0.2]$, $p_1=l_0$ may hold since value $i_1=5.0$ has a positive sign.

For instance, in a step 530, the position counter k may be incremented, and in a step 530 it may be checked whether there is another value in the leader vector, i.e. whether k≤n holds.

If yes, the method proceeds in step 520.

Thus, in the non-limiting example, with respect to position k=2, value 2.4 at position m=1 represents the 2-highest (k-highest) absolute value in the input vector. Thus, $$P_0 = l_1 \cdot \text{sign}(i_0) = -l_1$$

may hold for assigning $l_1$ with the respective sign in step 520, since value $i_0 = -2.4$ in the input vector has a negative sign.

In this way, for the non-limiting example, the loop may iterate through the positions of the leader vector in the following way:

$$k=3 \rightarrow m=3 \rightarrow P_2 = l_2 \cdot \text{sign}(i_2) = -l_2; \text{ and}$$

$$k=4 \rightarrow m=4 \rightarrow P_3 = l_3 \cdot \text{sign}(i_3) = +l_3$$

Accordingly, the respective potential code vector obtained by the method according to a fourth embodiment of the invention with respect to this non-limiting example may result in $p=[-l_1, l_0, -l_2, l_3]$ in case of the descending ordered respective leader vector l.

If the leader vector l is ordered in an ascending way, then the method described above may be performed with m representing the position of the k-lowest value in the absolute valued input vector, wherein $p_{m-1} = l_{k-1} \cdot \text{sign}(i_{m-1})$ may hold.

The obtained potential code vector p is associated with the respective set of basis code vectors $b_x$, wherein l represents the leader vector of this respective set of basis code vectors. For instance, with respect to the example process of determining a code vector based on a basis code vector $b_{x,y,t}$ and scale representative $s_z$ depicted in FIG. 2c and described above, the potential code vector p represents the nearest basis code vector $b_{x,y}$ of the set of basis code vectors $b_x$ with respect to the input vector, wherein the absolute valued input vector is used for determining the potential code vector of a respective set of basis code vectors and wherein the sign of each value $b_{x,y,k-1}$ at the kth position of the determined nearest basis code vector $b_{x,y}$ is assigned with the sign of the respective value $i_k$ at the kth position of the input vector i, wherein 0<k≤n holds.

Thus, this nearest basis code vector $b_{x,y}$ representing the potential code vector p can be used for determining a code vector $c_{x,z,y}$ based on the nearest basis code vector $b_{x,y}$ and based on a respective scale representative $s_z$, as exemplarily depicted in FIG. 2c and as described above.

In the sequel, a method according to a fifth embodiment of the invention will be presented. This method according to a fifth embodiment of the invention may be based on one or more of the methods according to a first, second, third and fourth method of the invention and will be explained by means of an C-source example of an implementation.

For instance, the leader classes may be defined by:

```
float pl[ ]={1, 1, 0, 0, 0, 0, 0, 0,
    0.5, 0.5, 0.5, 0.5, 0.5, 0.5, 0.5, 0.5,
    1, 1, 1, 1, 0, 0, 0, 0,
    2, 0, 0, 0, 0, 0, 0, 0,
    1.5, 0.5, 0.5, 0.5, 0.5, 0.5, 0.5, 0.5,   // 5
    1, 1, 1, 1, 1, 1, 0, 0,
    2, 1, 1, 0, 0, 0, 0, 0,
    1.5, 1.5, 0.5, 0.5, 0.5, 0.5, 0.5, 0.5,
    1, 1, 1, 1, 1, 1, 1, 1,
    2, 1, 1, 1, 1, 0, 0, 0,                   // 10
    2, 2, 0, 0, 0, 0, 0, 0,
    1.5, 1.5, 1.5, 0.5, 0.5, 0.5, 0.5, 0.5,
    2.5, 0.5, 0.5, 0.5, 0.5, 0.5, 0.5, 0.5,
    2, 1, 1, 1, 1, 1, 1, 0,
    2, 2, 1, 1, 0, 0, 0, 0,                   // 15
    3, 1, 0, 0, 0, 0, 0, 0};
```

For instance, these 16 leader classes may define the above mentioned second plurality of sets of basis code vectors, wherein a codebook structure may be defined by a plurality of set of basis code vectors representing a subset of said second plurality of sets of basis code vectors.

As an example, a codebook structure may be defined as

```
int no_leaders[ ]={4,7,9},
``` signifying that the first truncation, i.e. the first union of leader classes, is composed of the first 4 leader classes, the second one by the first 7 leader classes and so on.

To each truncation a different scale representative is assigned (e.g. through training), e.g.:

```
float scale[ ]={0.8,1.2,2.7};
```

Accordingly, for instance, a first set of code vectors of a plurality of code vectors of the codebook is defined by the first truncation scaled by the first scale representation 0.8, a second set of code vectors of the plurality of code vectors of the codebook is defined by the second truncation scaled by the second scale representation 1.2, and a third set of code vectors of the plurality of code vectors of the codebook is defined by the third truncation scaled by the third scale representation 2.7, the codebook having a multiple scale lattice structure.

As an example, the search in the multiple scale lattice structure may be seen as having two phases: the first one may compute a potential code vector for each leader class, i.e. for each set of basis code vectors, and the second one may calculate the distortion only for the potential codevectors.

The complexity reduction of the proposed method may come from the fact that for one leader vector the potential codevector is the same irrespective of the scale and it depends only on the relative order of the input vector components.

For instance, an absolute value function may be applied to the input vector i such that absolute input vector ia comprises the absolute values of the vector i, and then the absolute input vector may be sorted in an descending (or, alternatively, in an ascending) order.

As an example, an index representation may contain representatives indicating the indexes of each input vector i in the descendingly (or ascendingly) ordered absolute valued vector. For instance, said index representation may be an integer array 'indx'.

For example, if the input vector is [−2.4 5.0 −1.3 0.2], the absolute valued vector is [2.4 5.0 1.3 0.2] and the 'indx' array is [1 0 2 3]. Since the leader vectors may be descendingly ordered, during the nearest neighbour search algorithm, the first value of the leader vector may be assigned on the position corresponding to the highest absolute value component of the input vector and so on.

In the following non-limiting example, 'idx_lead_max' is the maximum number of leader classes out of all truncations, which may correspond to X, in this example may be is 9. Accordingly 9 sets of basis code vectors are defined by means of the 9 leader classer, wherein the nth leader class is defined by &pl[n−1].

For instance, the array 'sign' may store the signs of the input vector components.

```
/* First part of the search: compute all potential codevectors */
pl_crt = &pl[0]; /* pl contains the leader vectors */
for (u=0;u<idx_lead_max;u++)
{
        for(j=0;j<LATTICE_DIM;j++, pl_crt++)
        {
          j_crt = indx[j];
          if ( (*pl_crt) > 0. )
          {
                cv_pot[u][j_crt] = (*pl_crt)*(float)sign[j_crt];
          }
          else
          {
                cv_pot[u][j_crt] = 0.0f;
          }
        }
}
```

For instance, this first part of the search may be used for implementing the method according to a second embodiment of the invention depicted in FIG. 3.

The outer loop defined by counter u may be considered to implement an example of the loop depicted in FIG. 3, wherein each u is associated with a respective leader vector. Thus, in accordance with counter u, a corresponding set of basis code vectors is selected by means of the outer loop, since each leader vector corresponds to a different set of basis code vectors of the plurality of basis code vectors.

The inner loop defined by integer value j may be considered to correspond to step 320 for determining a potential basis code vector associated with the selected set of basis code vectors depicted in FIG. 3, wherein this inner loop may be considered to implement an example of the loop depicted in FIG. 3, wherein j_crt indicates the position of the (j+1) highest absolute value in the input vector, and wherein cv_pot [u][j_crt] (*pl_crt)*(float)sign[j_crt] may correspond to equation (8).

Thus, the different potential basis code vectors cv_pot are determined by means of this exemplary first part of the search.

The second part of the search may be used for determining a code vector for encoding the input vector from a subset of code vectors in step 220 of the method according to a second embodiment depicted in FIG. 2a, or, for instance, this second port of the search be considered to implement at least partially an example of the method according to a third embodiment depicted in FIG. 4.

```
/* Second part of the search */
for(l=0;l<no_scales;l++)
{
         s = scale[l];
         s2 = s*s;
         for(k=0;k<LATTICE_DIM;k++)
         {
           ws1[k] = w[k]*s*2.0f*in[k];
           ws2[k] = w[k]*s2;
         }
         for(j=0;j<no_leaders[l];j++)
         {
           tmp_dist = 0.0f;
           for(k=0;k<LATTICE_DIM;k++)
           {
                s = cv_pot[j][k];
                tmp_dist += (ws2[k]*s-ws1[k])*s;
           }
           if (tmp_dist < min_dist)
           {
                min_dist = tmp_dist;
                best_scale = l;
                best_idx = k;
           }
```
```
         }
}
```

The outer loop defined by counter l may be considered to implement an example of the outer loop depicted in FIG. 4, wherein l is issued to select one scale representation scale[l] of the plurality of scale representations, for example in accordance with step 410 shown in FIG. 4.

LATTICE_DIM defines the length of the code vectors which may correspond to the length of the input vector to be encoded.

Afterwards, the values ws1[k] and ws2[k] for each k in (0, . . . , LATTICE_DIM) are calculated, which may be considered to be that part of the distortion metric (×3) which is independent of potential basis code vector. The value w[k] represents the value of the weighting function for each k.

Then, the loop "for(j=0;j<no_leaders[l];j++)" may for instance be used to implement an example of steps 420-450 depicted in FIG. 4, wherein no_leaders[l] defines the set of leader vectors associated with the selected scale representative scale[l], i.e. no_leaders[l] may correspond to $n_z$ representing the number of sets of basis code vectors associated with the respective scale representative scale[l], and thus this loop iterates through each set of leader vectors associated with the selected scale representative scale[l], wherein for leader vector of this set of leader vectors one potential basis code vector cv_pot has been determined. Thus, for instance, this loop iteratively selects each potential basis code vector cv_pot the set of basis code vectors associated with the selected scale representation in accordance with step 420 in FIG. 4, wherein cv_pot[j] may represent the respective jth basis code vector of this set of basis code vectors.

For each of these basis code vectors and the selected scale representative, the respective distortion metric for the code vector being associated with the respective basis code vector and the selected scale representative may be determined, e.g. based on distortion metric (8) in accordance with step 440 in FIG. 4, in the following way:

$$d = \sum_{k=0}^{n-1} (ws2[k] \cdot \text{cv\_pot}[j][k] - ws1[k]) \cdot \text{cv\_pot}[j][k] \tag{9}$$

The distortion metric having the lowest value is determined to represent the best distortion metric, wherein the code vector associated with this distortion metric code vector may be used for encoding the input vector. For instance, this code vector may be defined by the best scale representative and the best potential basis code vector of the set of potential basis code vectors.

It has to be understood that the loops in these pseudo code examples are not limiting and may be arranged in a different way in order to extract the at least two code vector indexes from the single code vector index.

As used in this application, the term 'circuitry' refers to all of the following:
(a) hardware-only circuit implementations (such as implementations in only analog and/or digital circuitry) and
(b) combinations of circuits and software (and/or firmware), such as (as applicable):
(i) to a combination of processor(s) or
(ii) to portions of processor(s)/software (including digital signal processor(s)), software, and memory(ies) that work together to cause an apparatus, such as a mobile phone or a positioning device, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a positioning device.

With respect to the aspects of the invention and their embodiments described in this application, it is understood that a disclosure of any action or step shall be understood as a disclosure of a corresponding (functional) configuration of a corresponding apparatus (for instance a configuration of the computer program code and/or the processor and/or some other means of the corresponding apparatus), of a corresponding computer program code defined to cause such an action or step when executed and/or of a corresponding (functional) configuration of a system (or parts thereof).

The aspects of the invention and their embodiments presented in this application and also their single features shall also be understood to be disclosed in all possible combinations with each other. It should also be understood that the sequence of method steps in the flowcharts presented above is not mandatory, also alternative sequences may be possible.

The invention has been described above by non-limiting examples. In particular, it should be noted that there are alternative ways and variations which are obvious to a skilled person in the art and can be implemented without deviating from the scope and spirit of the appended claims.

The invention claimed is:

1. A method comprising:
   determining, for each set of basis code vectors of a plurality of sets of basis code vectors, a potential basis code vector for encoding an input vector, wherein each set of basis code vectors is associated with at least one scale representative of a plurality of scale representatives, and
   determining a code vector for encoding the input vector from a subset of code vectors, said subset of code vectors comprising, for each determined potential basis code vector and each scale representative associated with the set of basis code vectors of the respective potential basis code vector, a code vector based on the respective potential basis code vector scaled by the respective scale representative.

2. The method according to claim 1, wherein each scale representative of the plurality of scale representatives is associated with at least one set of code vectors, and each set of code vectors of said at least one set of code vectors associated with a respective scale representative is associated with a set of basis code vectors of the plurality of sets of basis code vectors such that each set of code vectors of said at least one set of code vectors associated with a respective scale representative comprises code vectors obtained by scaling the basis code vectors of the associated respective set of basis vectors with the respective scale representative.

3. The method according to claim 1, wherein at least one set of basis code vectors is associated with at least two scale representatives.

4. The method according to claim 1, wherein said determining, for each set of basis code vectors of a plurality of sets of basis code vectors, a potential basis code vector for encoding the input vector comprises determining the basis code vector on the basis of the respective set of basis code vectors which represents a nearest neighbour to the input code vector.

5. The method according to claim 4, wherein said sets of basis code vectors are leader classes, and wherein each leader class comprises a different leader vector and permutations of said leader vector, and wherein each leader vector represents an n-dimensional vector comprising n absolute values arranged in a descending or an ascending order, wherein said determining the potential code base vector of the respective set of basis code vectors comprises one of:
   assign the value in position k in the leader vector of the respective set of basis code vectors to a position in the potential basis code vector which corresponds to the position of the k-highest absolute value of the input vector and setting the sign of this assigned value in the potential code base vector in accordance with the sign of the value of the input vector associated with the k-highest absolute value of the input vector, wherein $0 \leq k < n$ holds, in case the values of each leader vector are arranged in an descending order; and
   assign the value in position k in the leader vector of the respective set of basis code vectors to a position in the potential code base vector which corresponds to the position of the k-lowest absolute value of the input vector and setting the sign of this assigned value in the potential code base vector in accordance with the sign of the value of the input vector associated with the k-lowest absolute value of the input vector, wherein $0 \leq k < n$ holds, in case the values of each leader vector are arranged in an ascending order.

6. The method according to claim 1, wherein said determining a code vector for encoding the input vector comprises for each determined potential basis code vector and for each scale representative associated with the set of basis code vectors of the respective potential basis code vector determining a distortion metric based on the respective code vector and the input, wherein the respective code vector represents the code vector based on the respective potential basis code vector scaled by the respective scale representative.

7. The method according to claim 6, wherein the distortion metric represents a distance between the respective code vector and the input vector.

8. The method according to claim 7, wherein the respective code vector represents an n-dimensional vector comprising code vector values $c_0 \ldots {}_{n-1}$ and the input vector represents an n-dimensional vector comprising input vector values $i_0 \ldots i_{n-1}$, wherein determining the respective distance d is performed based on calculating $$d = \sum_{k=0}^{n-1} c_k^2 - 2\sum_{k=0}^{n-1} i_k \cdot c_k.$$

9. The method according to claim 6, wherein the distortion metric is determined based on a weighting function.

10. The method according to claim 6, wherein the respective code vector represents an n-dimensional vector comprising code vector values $c_0 \ldots {}_{n-1}$ and the input vector represents an n-dimensional vector comprising input vector values $i_0 \ldots i_{n-1}$, wherein determining the respective distance d is performed based on calculating $$d = \sum_{k=0}^{n-1} w_k \cdot c_k^2 - 2\sum_{k=0}^{n-1} w_k \cdot i_k \cdot c_k,$$

wherein $w_k$ represent weighting factors of the weighting function.

11. The method according to claim 1, wherein said input vector at least partially represents at least one of a video, image, audio and speech signal.

12. The method according to claim 1, wherein said sets of basis code vectors are leader classes, and wherein each leader class comprises a different leader vector and permutations of said leader vector.

13. An apparatus, comprising at least one processor; and at least one memory including computer program code, said at least one memory and said computer program code configured to, with said at least one processor, cause said apparatus at least to:
  determine, for each set of basis code vectors of a plurality of sets of basis code vectors, a potential basis code vector for encoding an input vector, wherein each set of basis code vectors is associated with at least one scale representative of a plurality of scale representatives; and
  determine a code vector for encoding the input vector from a subset of code vectors, said subset of code vectors comprising, for each determined potential basis code vector and each scale representative associated with the set of basis code vectors of the respective potential basis code vector, a code vector based on the respective potential basis code vector scaled by the respective scale representative.

14. The apparatus according to claim 13, wherein each scale representative of the plurality of scale representatives is associated with at least one set of code vectors, and each set of code vectors of said at least one set of code vectors associated with a respective scale representative is associated with a set of basis code vectors of the plurality of sets of basis code vectors such that each set of code vectors of said at least one set of code vectors associated with a respective scale representative comprises code vectors obtained by scaling the basis code vectors of the associated respective set of basis vectors with the respective scale representative.

15. The apparatus according to claim 13, wherein at least one set of basis code vectors is associated with at least two scale representatives.

16. The apparatus according to claim 13, wherein said apparatus caused to determine, for each set of basis code vectors of a plurality of sets of basis code vectors, a potential basis code vector for encoding the input vector is further caused to determine the basis code vector on the basis of the respective set of basis code vectors which represents a nearest neighbour to the input code vector.

17. The apparatus according to claim 16, wherein said sets of basis code vectors are leader classes, and wherein each leader class comprises a different leader vector and permutations of said leader vector, and wherein each leader vector represents an n-dimensional vector comprising n absolute values arranged in a descending or an ascending order, wherein said apparatus caused to determine the potential code base vector of the respective set of basis code vectors is further caused to one of:
  assign the value in position k in the leader vector of the respective set of basis code vectors to a position in the potential basis code vector which corresponds to the position of the k-highest absolute value of the input vector and setting the sign of this assigned value in the potential code base vector in accordance with the sign of the value of the input vector associated with the k-highest absolute value of the input vector, wherein 0≤k<n holds, in case the values of each leader vector are arranged in an descending order; and
  assign the value in position k in the leader vector of the respective set of basis code vectors to a position in the potential code base vector which corresponds to the position of the k-lowest absolute value of the input vector and setting the sign of this assigned value in the potential code base vector in accordance with the sign of the value of the input vector associated with the k-lowest absolute value of the input vector, wherein 0≤k<n holds, in case the values of each leader vector are arranged in an ascending order.

18. The apparatus according to claim 13, wherein said apparatus caused to determine a code vector for encoding the input vector comprises for each determined potential basis code vector and for each scale representative associated with the set of basis code vectors of the respective potential basis code vector is further caused to determine a distortion metric based on the respective code vector and the input, wherein the respective code vector represents the code vector based on the respective potential basis code vector scaled by the respective scale representative.

19. The apparatus according to claim 18, wherein the distortion metric represents a distance between the respective code vector and the input vector.

20. The apparatus according to claim 19, wherein the respective code vector represents an n-dimensional vector comprising code vector values $c_0 \ldots {}_{n-1}$ and the input vector represents an n-dimensional vector comprising input vector values $i_0 \ldots i_{n-1}$, wherein determining the respective distance d is performed based on calculating $$d = \sum_{k=0}^{n-1} c_k^2 - 2\sum_{k=0}^{n-1} i_k \cdot c_k.$$

21. The apparatus according to claim 18, wherein the distortion metric is determined based on a weighting function.

22. The apparatus according to claim 21, wherein the respective code vector represents an n-dimensional vector comprising code vector values $c_0 \ldots {}_{n-1}$ and the input vector represents an n-dimensional vector comprising input vector values $i_0 \ldots i_{n-1}$, wherein determining the respective distance d is performed based on calculating $$d = \sum_{k=0}^{n-1} w_k \cdot c_k^2 - 2\sum_{k=0}^{n-1} w_k \cdot i_k \cdot c_k,$$

wherein $w_k$ represent weighting factors of the weighting function.

23. The apparatus according to claim 13, wherein said input vector at least partially represents at least one of a video, image, audio and speech signal.

24. The apparatus according to claim 13, wherein said sets of basis code vectors are leader classes, and wherein each leader class comprises a different leader vector and permutations of said leader vector.

* * * * *